United States Patent
Douthit et al.

(10) Patent No.: US 9,436,238 B1
(45) Date of Patent: Sep. 6, 2016

(54) CONVECTION-COOLED ELECTRONIC SYSTEM

(71) Applicant: Adtran, Inc., Huntsville, AL (US)

(72) Inventors: Micah L. Douthit, Madison, AL (US); Jon M. Chalmers, Madison, AL (US); Clinton R. Blasingame, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 28 days.

(21) Appl. No.: 14/642,537

(22) Filed: Mar. 9, 2015

(51) Int. Cl.
*G06F 1/20* (2006.01)
*H05K 7/20* (2006.01)
*H05K 5/02* (2006.01)
*G06F 1/16* (2006.01)

(52) U.S. Cl.
CPC ............ *G06F 1/203* (2013.01); *G06F 1/1632* (2013.01); *H05K 5/0234* (2013.01); *H05K 7/20127* (2013.01)

(58) Field of Classification Search
CPC ............. G06F 1/1632; H05K 5/0204; H05K 7/20009; H05K 7/20127
See application file for complete search history.

(56) References Cited

U.S. PATENT DOCUMENTS

| | | | |
|---|---|---|---|
| 6,229,507 B1* | 5/2001 | Nakamura | H05K 5/0017 340/815.45 |
| 6,837,058 B1* | 1/2005 | McEuen | G06F 1/1626 361/679.41 |
| 6,937,463 B2* | 8/2005 | Chung | F16M 11/00 29/828 |
| 7,386,868 B2* | 6/2008 | McCormack | G06F 1/1632 361/679.41 |
| 7,453,693 B2* | 11/2008 | Tomino | H05K 5/0204 165/185 |
| 7,480,140 B2* | 1/2009 | Hara | H05K 7/20145 312/223.2 |
| 7,480,141 B2* | 1/2009 | Takenoshita | G06F 1/203 349/161 |
| 7,527,228 B2* | 5/2009 | Chung | F16M 11/00 248/154 |
| 7,712,621 B2* | 5/2010 | Cho | H05K 5/0213 220/4.28 |
| 7,764,501 B2* | 7/2010 | Gu | G06F 1/1626 165/104.26 |
| 8,929,070 B2* | 1/2015 | Liu | H05K 7/20145 165/104.33 |
| 9,086,072 B1* | 7/2015 | Davis | F04D 17/16 |
| 9,229,499 B2* | 1/2016 | Kirkpatrick | H05K 7/20136 |

* cited by examiner

*Primary Examiner* — Robert J Hoffberg
(74) *Attorney, Agent, or Firm* — Smith Tempel Blaha LLC; Michael J. Tempel

(57) ABSTRACT

A convection-cooled electronic system includes an electronic device and a stand. The electronic device has air intake openings in a lower housing portion and air exhaust openings in an upper housing portion. The stand has air intake openings. The stand has a periphery, a flat base, and a slot extending across the widest portion of the stand. The slot has a shape configured to receive the lower portion of the device housing. Heat emitted by electronic components within the device housing creates airflow by convection, which causes air to be drawn into the stand through the stand air intake openings and communicated into the device air intake openings. The air is heated as it passes through the device housing, and the heated air exits the device housing through the air exhaust openings.

22 Claims, 9 Drawing Sheets

CONVECTION-COOLED ELECTRONIC SYSTEM

BACKGROUND

Various types of electronic equipment contain electronic components that generate thermal energy, i.e., heat, as an undesired by-product of their operation. Electronic equipment therefore commonly includes thermal management or "cooling" systems for dissipating excess heat that could otherwise impair the components. For example, the housing or enclosure of such equipment may include vents. A fan in the housing causes air to flow into the housing through one vent or set of vents, through the housing, and then out of the housing through another vent or set of vents. The airflow carries excess heat from the interior of the housing to the external environment.

In a home or small business office, there may be a need to install a small, i.e., desktop or tabletop, telecommunications device, such as modem, residential gateway, wireless access point, etc. Such telecommunications devices commonly have box-shaped enclosures, with various switches, connector sockets, indicator lights, etc., on the sides of the enclosure. To provide a compact shape that can rest unobtrusively on a desk or table, the enclosure may have a length substantially greater than its thickness, somewhat resembling a book in shape. For various reasons, design constraints may be imposed on the location of vents and other thermal management features in the enclosure.

SUMMARY

Embodiments of the invention relate to a system and method in which an electronic device is cooled by air convection through a stand on which the device is mounted. In an exemplary embodiment, the electronic device has a device housing and one or more thermal energy-emitting electronic components mounted within the housing between lower and upper portions of the device housing. The lower device housing portion has multiple air intake openings, and the upper device housing portion has multiple air exhaust openings. In the exemplary embodiment, the stand has a housing with a periphery and a substantially flat base. The stand housing also has multiple air intake openings distributed about the periphery that allow air to flow in from the exterior of the stand housing to the interior of the stand housing. The stand housing has a slot located across the periphery. The slot has a shape corresponding to the shape of the lower device housing portion such that the lower device housing portion is configured to fit within the slot. When the lower device housing portion is received in the slot, the device air intake openings extend into the slot.

In operation, the heat emitted by the electronic components within the device housing creates airflow by convection. Convection causes air to be drawn into the stand through the stand air intake openings and communicated from the interior of the stand into the device air intake openings that extend into the slot. Heat in the device housing is transferred to the air as the air passes through the device housing, and the heated air exits the device housing through the device air exhaust openings in the upper device housing portion, thus removing heat from the device housing.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
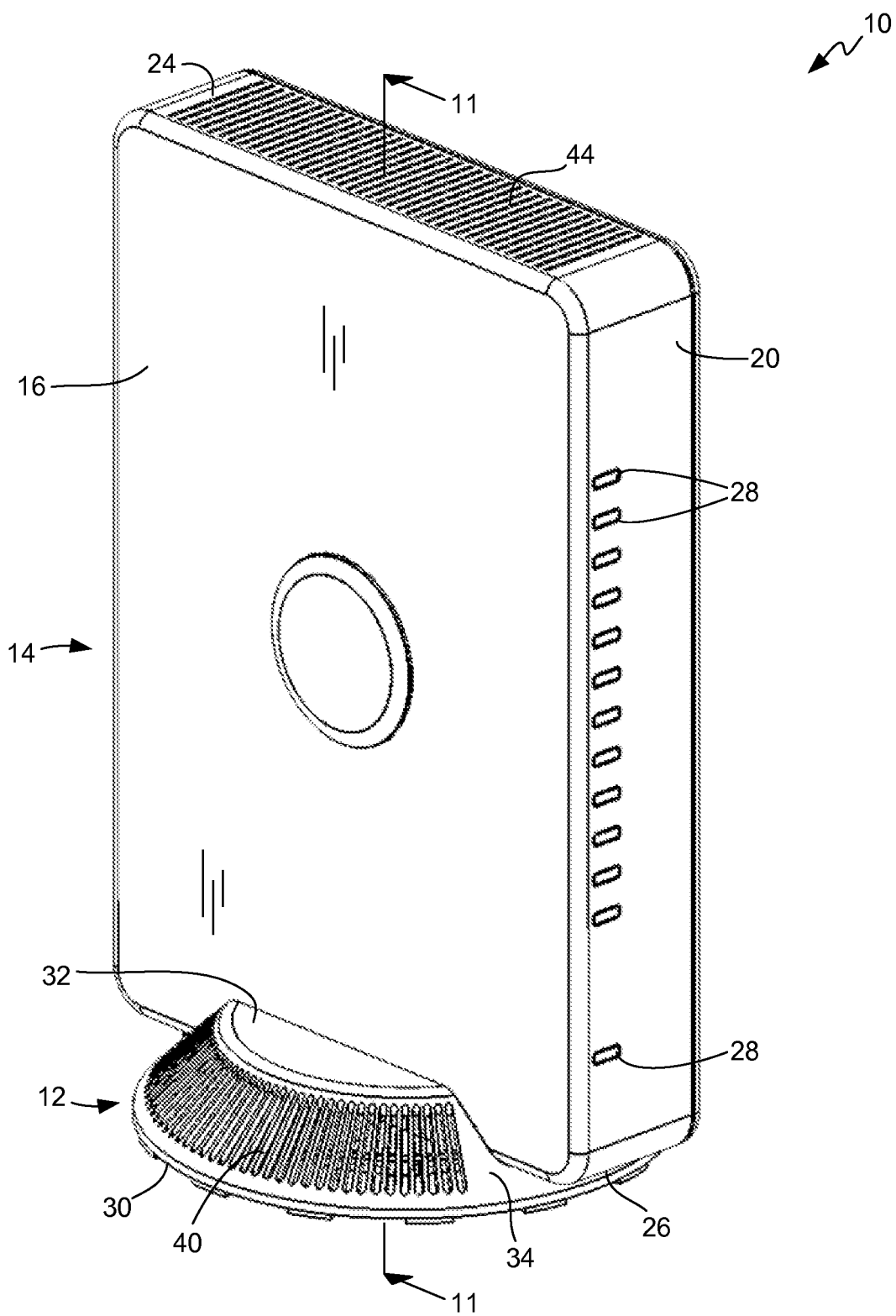
FIG. 1 is a perspective view of a system in which an electronic device is mounted on a stand, in accordance with an exemplary embodiment of the invention.
Figure 2:
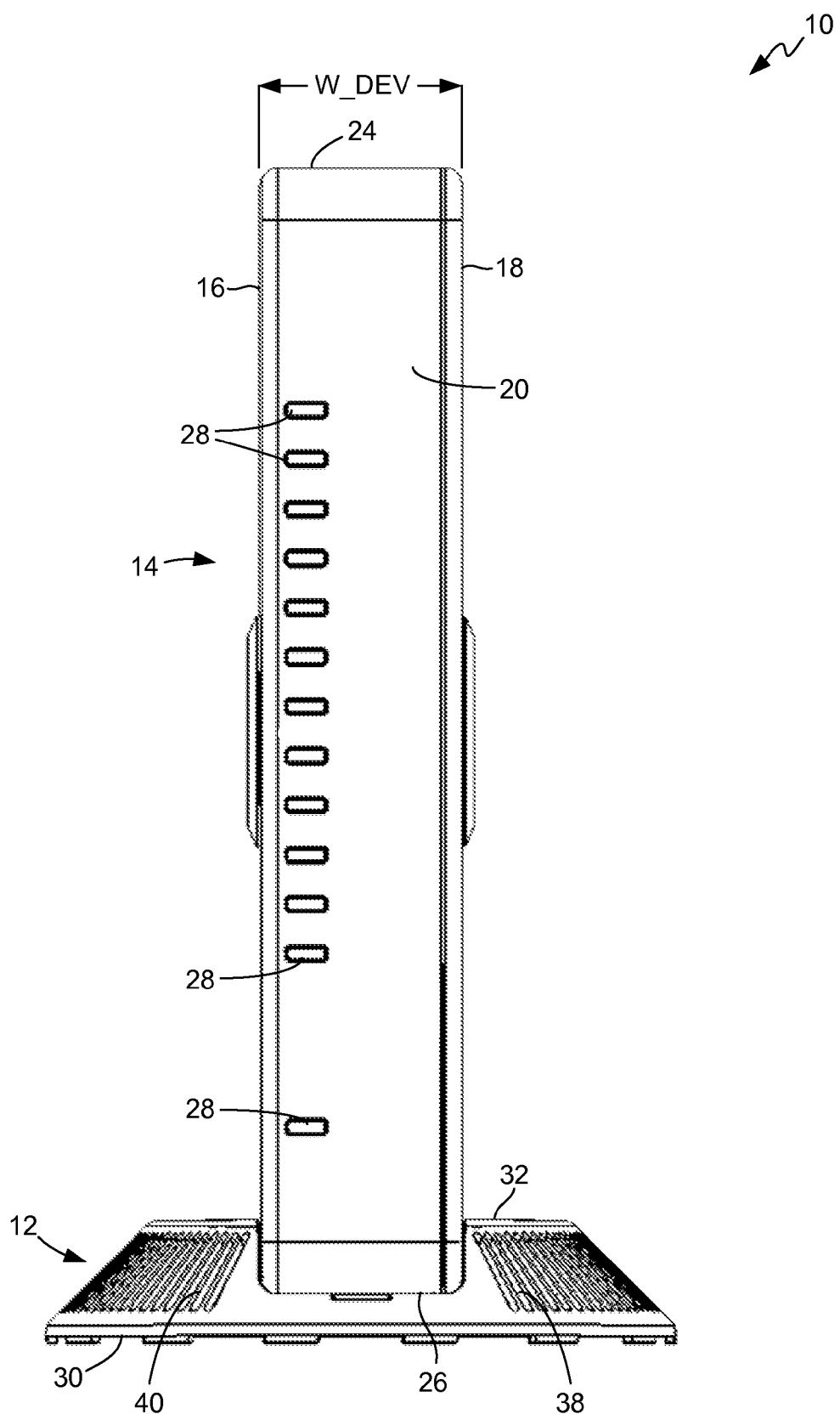
FIG. 2 is a front elevation view of the system of FIG. 1.
Figure 3:
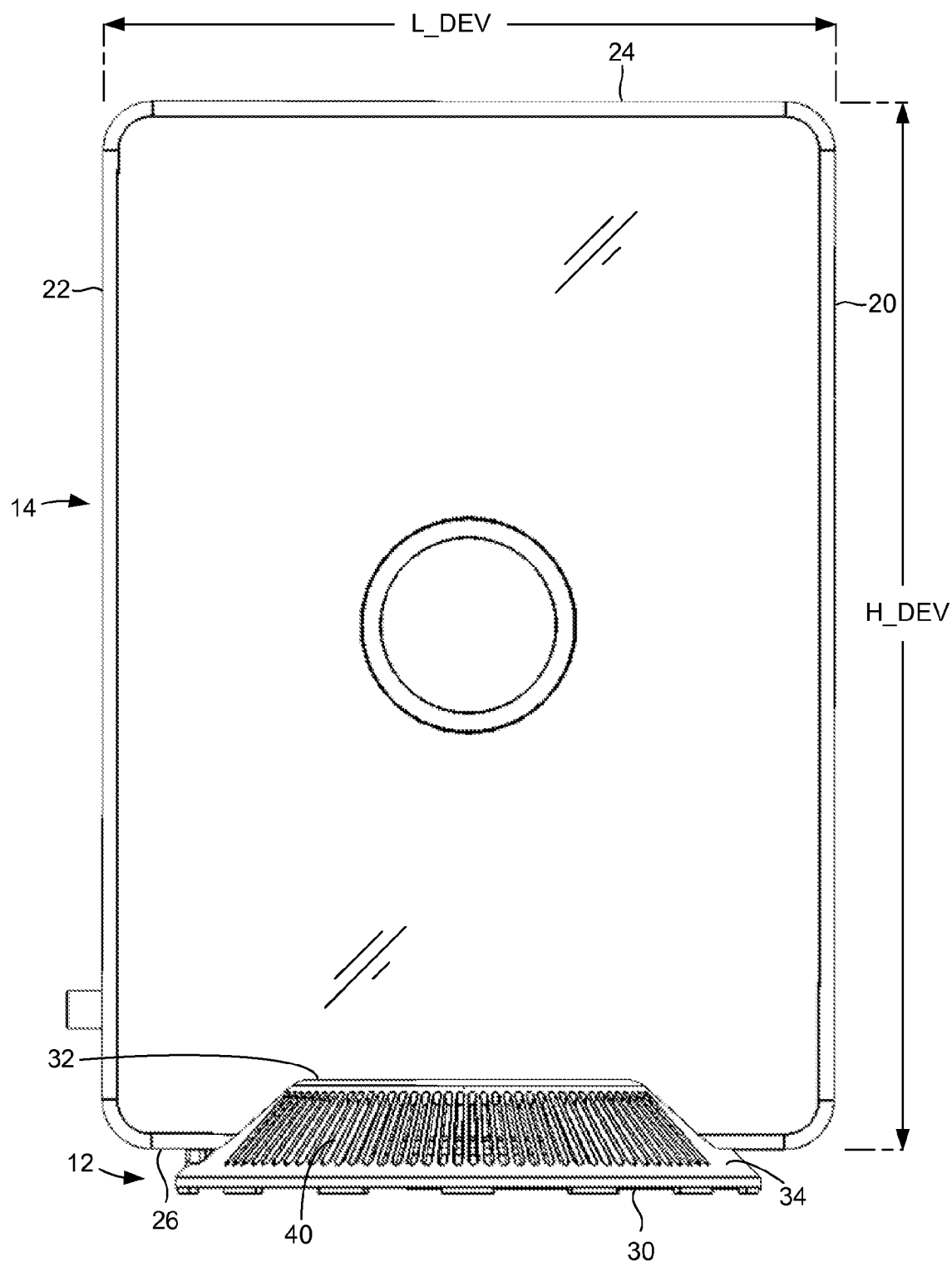
FIG. 3 is a side elevation view of the system of FIG. 1.

As illustrated in, for example, FIGS. 1-3, in an illustrative or exemplary embodiment of the invention, a system 10 includes a stand 12 and an electronic device 14. Electronic device 14 can be, for example, a modem, a residential gateway, a wireless access point, or a hybrid of such devices or similar types of devices. Generally, electronic device 14 is of a type that is placed on a table, desk, shelf or similar flat surface (not shown) and connected by one or more electrical or optical signal cables (not shown) to another electronic device, such as a computer, or to a digital communications network. Although in other embodiments such an electronic device can have other shapes, in the exemplary embodiment electronic device 14 has a box-shaped housing defined by a first side panel 16 (FIGS. 1 and 2), a second side panel 18 (FIG. 2) parallel to first side panel 16, a front panel 20 (FIGS. 1-3), a rear panel 22 (FIG. 3) parallel to front panel 20 and perpendicular to side panels 16 and 18, a top panel 24 (FIGS. 1-3), and a bottom panel 26 (FIGS. 1-3) parallel to top panel 24. The terms "front," "rear," "side," "top" and "bottom" are used only for convenience of description and are not intended to imply any characteristics or other limitations. Front panel 20 can have, for example, indicator lamps 28 or other features. Although not shown for purposes of clarity, rear panel 22 can have connector jacks or other features.

In the exemplary embodiment, stand 12 has a generally circular periphery. More specifically, in the exemplary embodiment stand 12 has a frusto-conical shape defined by a generally circular base 30, a generally circular or disc-shaped top 32 of smaller diameter than base 30, and a sloping sidewall 34 between base 30 and top 32. Base 30 defines a plane on which stand 12 can be rested on a table, desk, shelf or other surface (not shown). In other embodiments, such a stand may have other suitable shapes, such as rectangular, square, triangular, etc.

Figure 4:
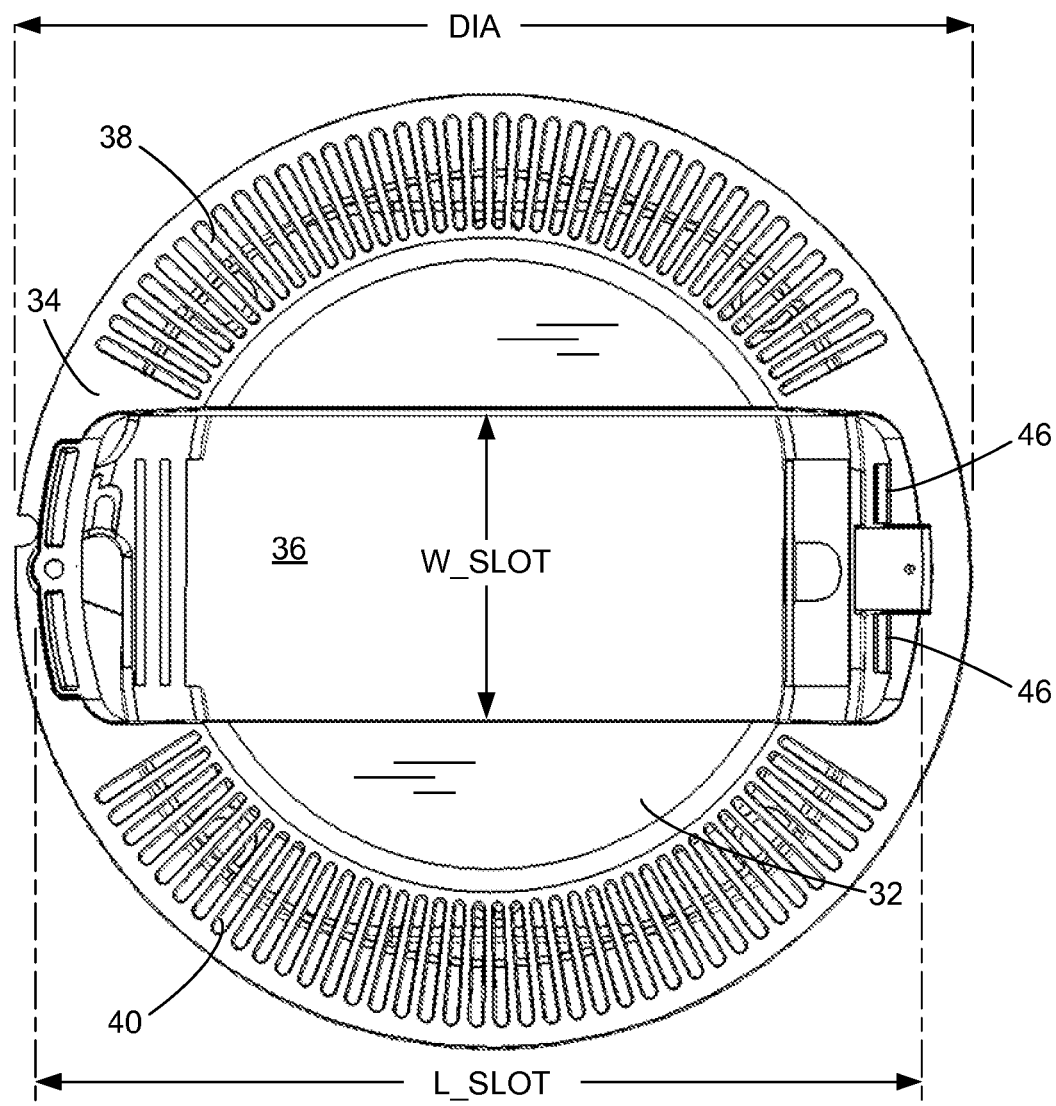
FIG. 4 is a top plan view of the stand of the system of FIG. 1.
Figure 5:
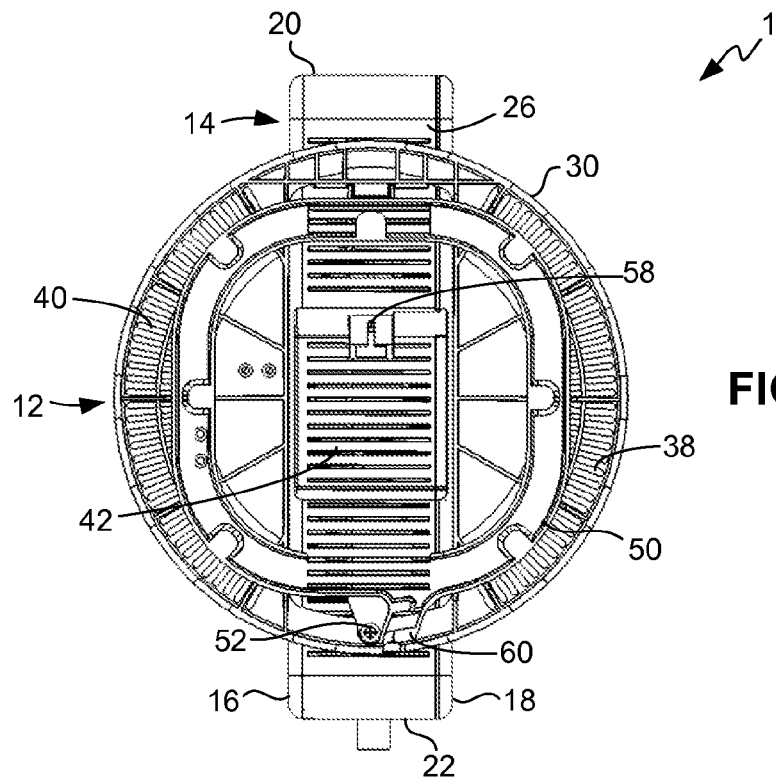
FIG. 5 is a bottom plan view of the system of FIG. 1.

As further illustrated in FIG. 4, stand 12 has a slot 36 with a substantially rectangular shape. Accordingly, slot 36 has a length ("L_SLOT") and a width ("W_SLOT"). Slot 36 extends length-wise across the widest part or diameter ("DIA") of stand 12. Slot 36 thus also extends across the diameter of top 32, forming a substantially rectangular opening in top 32 between the exterior and interior of stand 12. It can also be noted that slot 36 intersects sidewall 34. In embodiments (not shown) in which the periphery has a shape other than circular, such a slot can extend across the width or widest part of the stand.

Sidewall 34 has air intake gratings 38 and 40 on opposing sides of slot 36. Each of air intake gratings 38 and 40 is defined by closely spaced apertures or openings between the exterior and interior of stand 12. Each opening has an elongated, substantially rectangular shape, elongated parallel to the surface of sidewall 34. On each side of slot 36 these closely spaced openings are distributed in sidewall 34 along an arc-shaped region defining a respective one of air intake gratings 38 and 40.

Figure 6:
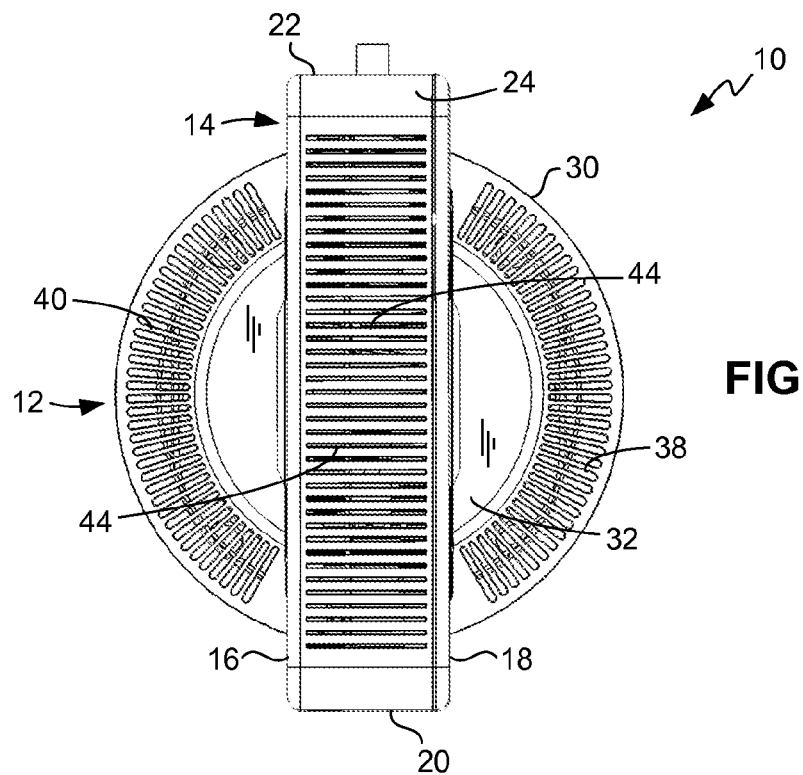
FIG. 6 is a top plan view of the system of FIG. 1.
Figure 7:
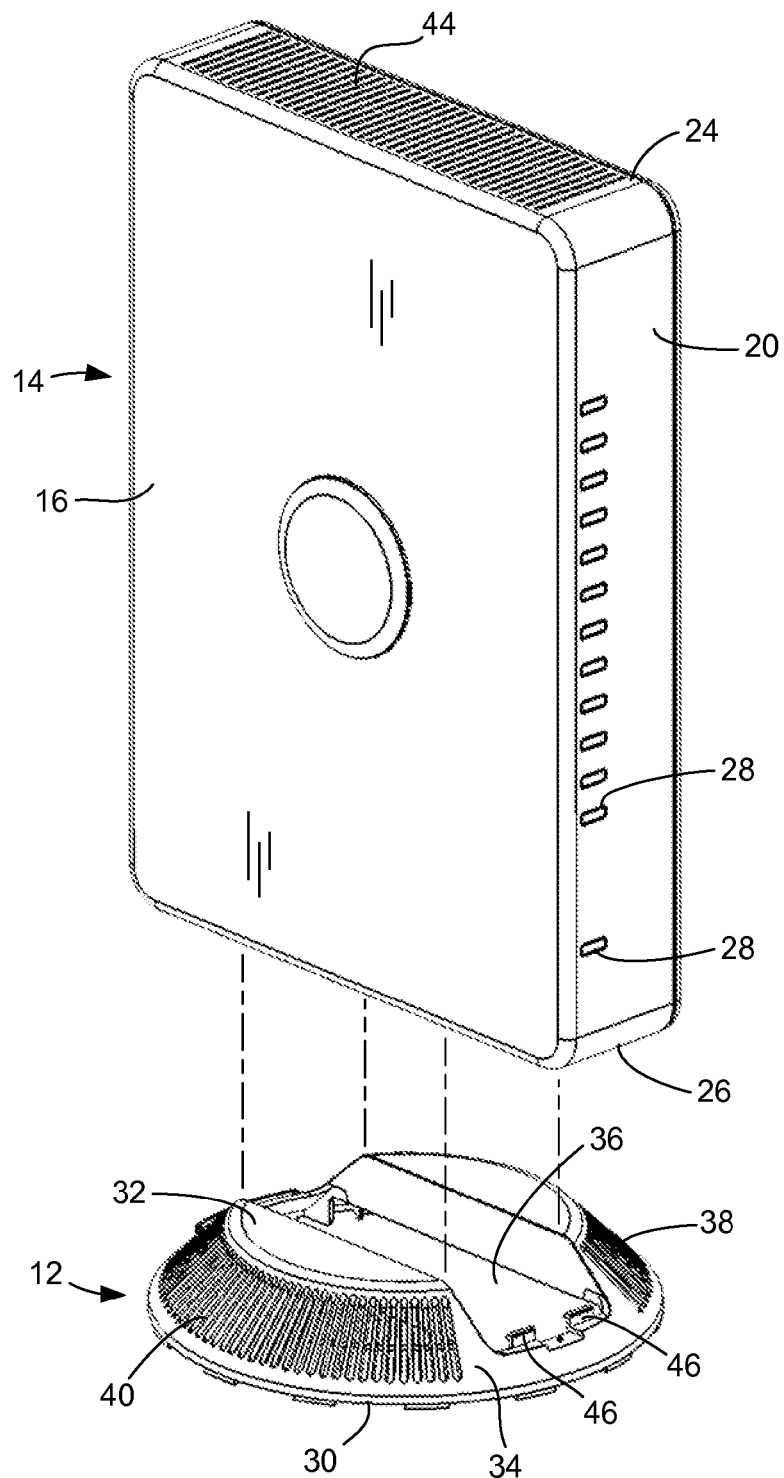
FIG. 7 is an assembly view of the system, showing the mounting of the electronic device to the stand.
Figure 8:
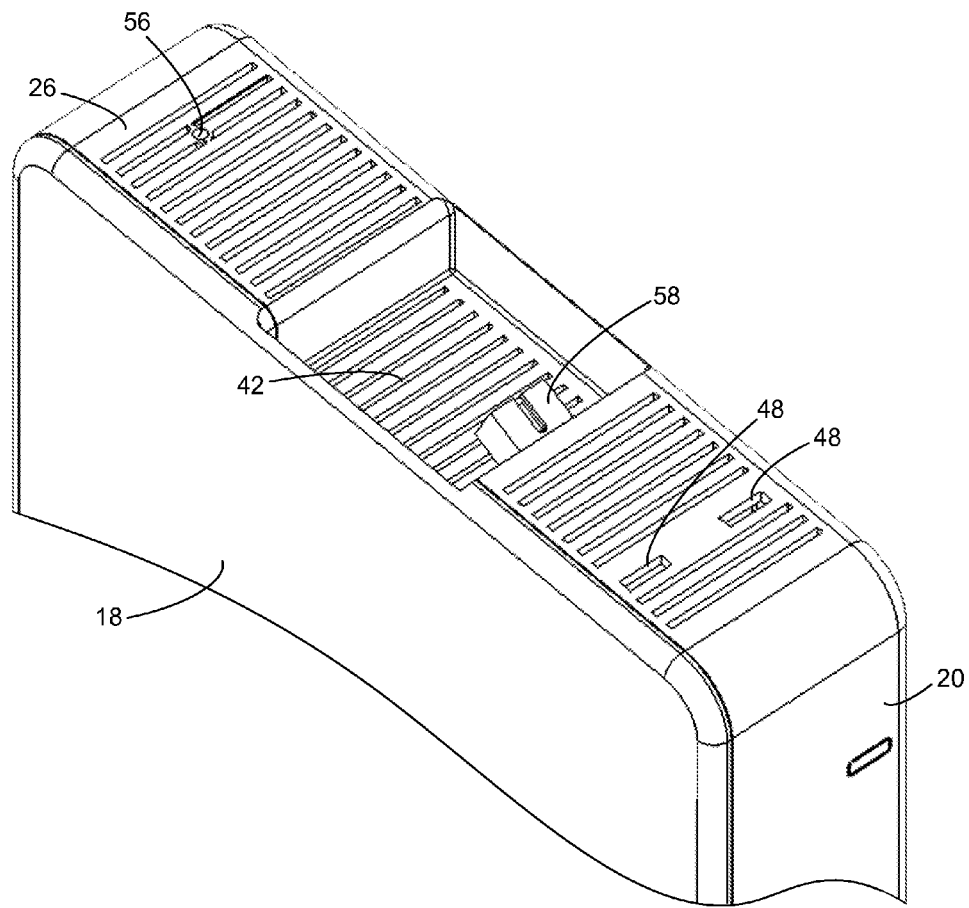
FIG. 8 is a perspective view of the bottom of the electronic device.
Figure 9:
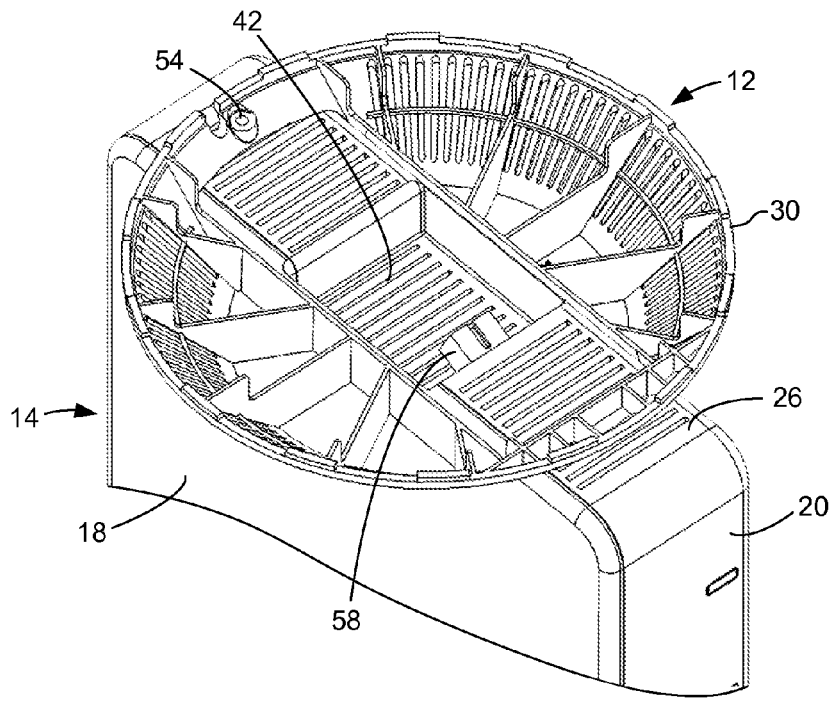
FIG. 9 is a perspective view of the stand mounted on the bottom of the electronic device.

As illustrated in FIGS. 5 and 8-10, a device air intake grating 42 is defined by closely spaced, parallel apertures or openings in bottom panel 26 of device 14, i.e., between the exterior and interior of the housing of device 14. As illustrated in FIGS. 6-7, a device air exhaust grating 44 is similarly defined by closely spaced, parallel apertures or openings in top panel 24 of device 14, i.e., between the exterior and interior of the housing of device 14. Note that in the exemplary embodiment side panels 16 and 18 have no openings or other airflow or vent features.

The openings that define air intake gratings 38, 40 and 42 and air exhaust grating 44 can have a uniform width and rounded ends to promote smooth airflow, i.e., inhibit turbulent airflow. The spacing between adjacent openings can be uniform and substantially equal to or even slightly less than the width of the openings, to promote both airflow and structural integrity. Note that the spacing of the openings that define air intake gratings 38 and 40 is slightly less than the width of the openings, thereby providing a louvered appearance and airflow effect.

As illustrated in FIG. 7, the lower portion of the housing of device 14, defined primarily by bottom panel 26, fits snugly within slot 36. More specifically, the device housing has a thickness or width ("W_DEV" in FIG. 2) almost or substantially equal to the slot width ("W_SLOT" in FIG. 4) of slot 36, thereby providing a snug fit, such as an interference fit or frictional fit. As a result of this snug or frictional fit and additional attachment features described below, stand 12 provides a stable base for supporting electronic device 14. The relative dimensions between stand 12 and device 14 can aid this stabilizing function. In the exemplary embodiment, the device housing length ("L_DEV" in FIG. 3) is greater than the slot length ("L_SLOT" in FIG. 4) of slot 36. Thus, when device 14 is mounted on stand 12, device 14 overhangs or extends beyond the ends of slot 36 in this housing length ("L_DEV") dimension. This feature can promote stability in a forward-rearward direction. In addition, it can be noted that in the exemplary embodiment the device housing height ("H_DEV" in FIG. 3) is approximately twice the device housing length ("L_DEV"), such that the device housing has an elongated rectangular shape. In other embodiments, the device housing can have a still greater height relative to its length, as the configuration can provide a stable support for such "tall" electronic devices. The configuration can promote lateral stability even for relatively tall electronic devices because, among other reasons, the device housing thickness or width ("W_DEV") is about one-third of the diameter ("DIA" in FIG. 4) of stand 12. Note that the diameter ("DIA") of stand 12 relates to the stability or tendency to remain upright of stand 12 when resting on a surface (not shown). Correspondingly, the slot width ("W_SLOT") of slot 36 is about one-third the diameter ("DIA") of stand 12. In other embodiments (not shown), the slot width of such a stand can be between about, for example, one-quarter and one-half the stand diameter.

Additional features promote a secure connection between stand 12 and device 14. These features include two hooked tabs 46 (FIGS. 4 and 7) on stand 12. To assemble stand 12 to device 14, hooked tabs 44 are inserted into two corresponding openings 48 (FIG. 8) in bottom panel 26 of device 14. Then, the lower portion of device 14 is seated within slot 36 to form the assembly shown in FIG. 9. Note that when the lower portion of device 14 is seated within slot 36, device air intake grating 42 extends into slot 36 and thus into the interior of stand 12. In this position, air can be communicated between the interior of stand 12 and device air intake grating 42.

Figure 10:
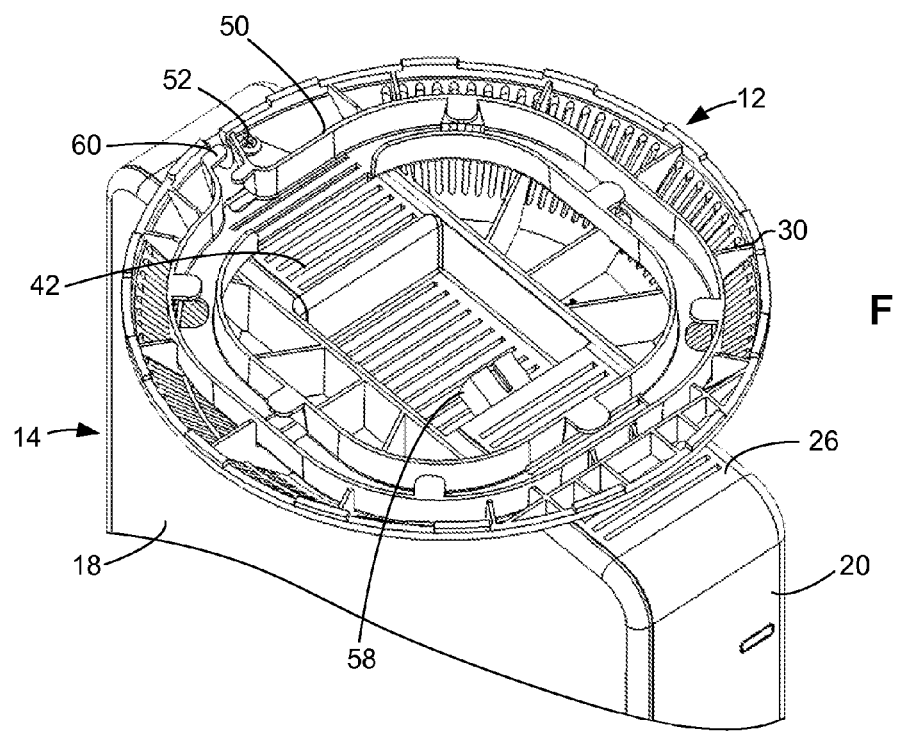
FIG. 10 is a perspective view of the stand and cable tray mounted on the bottom of the electronic device.

As illustrated in FIG. 10, a cable tray 50 is then inserted inside stand 12. A screw 52 is then routed through corresponding holes 54 (FIG. 9) in cable tray 50 and stand 12 into a threaded bore 56 (FIG. 8) in bottom panel 26 to secure cable tray 50 and stand 12 to electronic device 14. Although not shown for purposes of clarity, an optical or electrical cable that is connected to a connector 58 (FIGS. 8-10) of device 14 can be wound inside cable tray 50 for storage. A portion of the cable can exit stand 21 through a guide structure 60 (FIGS. 5 and 10) in cable tray 50.

Figure 11:
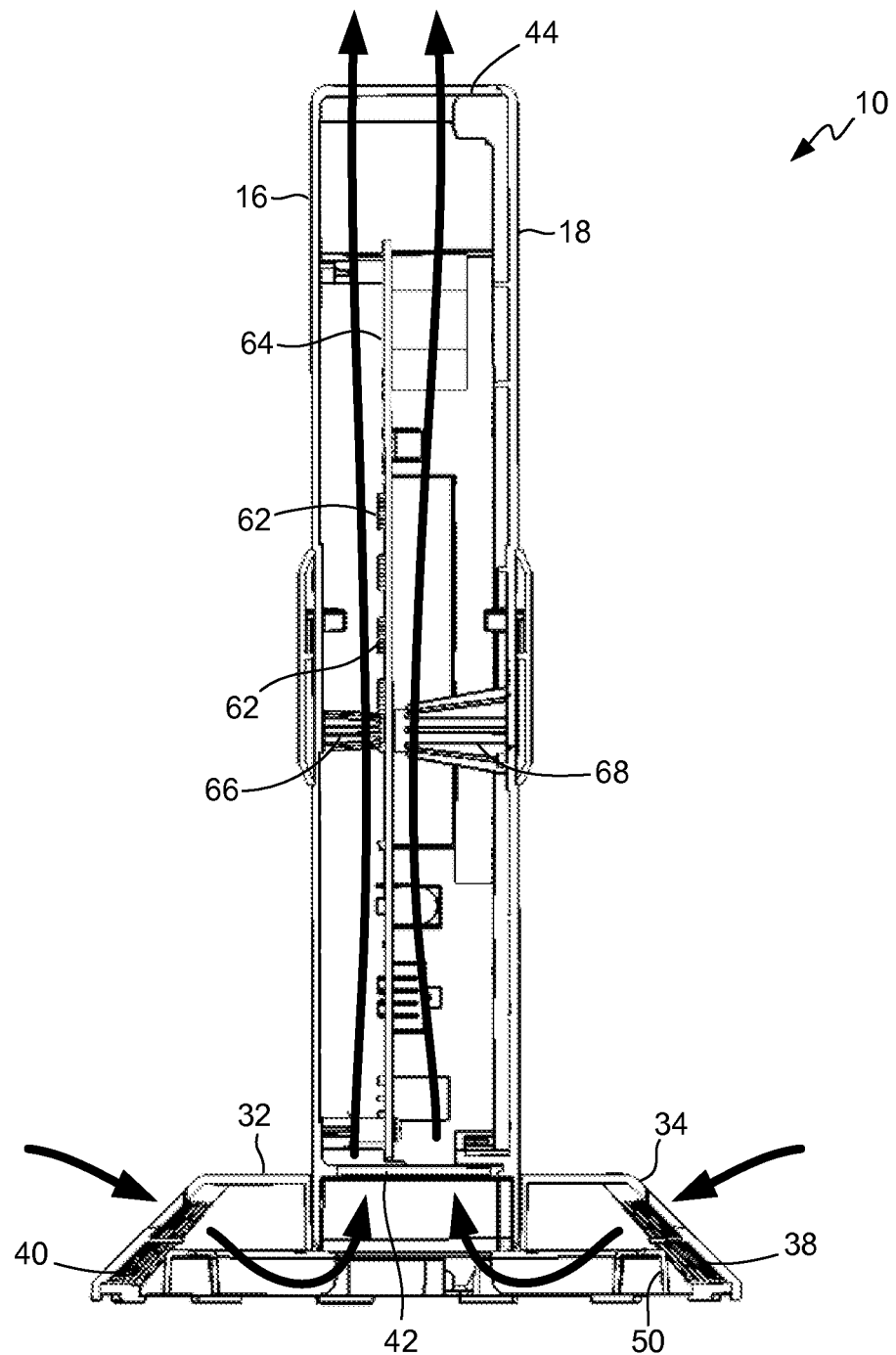
FIG. 11 is a sectional view taken on line 11-11 of FIG. 1, showing airflow through the system that promotes cooling of electronic components within the electronic device.

As illustrated in FIG. 11, a number of thermal energy-emitting electronic components 62 are mounted on a printed circuit board (PCB) 64 in electronic device 14. Standoff structures 66 and 68 capture PCB 64 to help position PCB 64 within the housing of device 14. In operation, electronic components 62 emit heat, which generates air movement or airflow by convection. As illustrated by the arrows in FIG. 11, this airflow enters the interior of stand 12 through air intake gratings 38 and 40. The airflow continues into the interior of the housing of device 14 through device air intake grating 42 (FIGS. 5 and 8-10). The resulting airflow through the housing and past the heat-emitting electronic components 62 carries the emitted heat away. The airflow exits the housing through device air exhaust grating 44 (FIGS. 1, 6 and 7). The airflow thus removes heat from the interior of the device housing that could otherwise impair electronic components 62 or other features of electronic device 14. Also, as stand 12 supports bottom panel 26 above the desk, table or other surface (not shown) on which stand 12 rests, the surface is protected against potential damage by heat emanating from bottom panel 26.

One or more illustrative or exemplary embodiments of the invention have been described above. However, it is to be understood that the invention is defined by the appended claims and is not limited to the specific embodiments described.

What is claimed is:

1. A system, comprising:
an electronic device having a device housing and one or more thermal energy-emitting electronic components, the device housing having a lower device housing portion and an upper device housing portion, the lower device housing portion having a plurality of device air intake openings, the upper device housing portion having a plurality of device air exhaust openings, the one or more thermal energy-emitting electronic components mounted in an interior of the device housing between the lower device housing portion and the upper device housing portion along a device airflow path between the device air intake openings and the device air exhaust openings; and a stand having a stand housing with a periphery and a base, the stand housing having a plurality of stand air intake openings distributed about the periphery between an exterior of the stand housing and an interior of the stand housing, the stand housing having a slot extending across the periphery, the slot having a shape corresponding to a shape of the lower device housing portion and configured to receive the lower device housing portion, the device air intake openings extending into the slot and in airflow communication with the stand air intake openings when the lower device housing portion is received in the slot.

2. The system of claim 1, wherein the slot defines a correspondingly slot-shaped opening between the exterior of the stand housing and the interior of the stand housing.

3. The system of claim 1, wherein the device housing is box-shaped, the lower device housing portion is rectangular, and the slot is rectangular.

4. The system of claim 3, wherein the device housing has no airflow openings other than the plurality of device air intake openings in a bottom panel of the device housing and the plurality of device air exhaust openings in a top panel of the device housing.

5. The system of claim 3, wherein the lower device housing portion defines a device housing length, and the device housing length is greater than a length of the slot.

6. The system of claim 5, wherein the device housing further has a device housing height, and the device housing height is at least twice the device housing length.

7. The system of claim 1, wherein the device housing further has a device housing width substantially equal to a width of the slot, and the width of the slot is between one-half and one-quarter of a widest portion of the stand housing.

8. The system of claim 7, wherein the stand housing has a circular periphery, and the slot is diametrically located across the circular periphery.

9. The system of claim 8, wherein the stand housing has a frusto-conical shape, defined by the substantially flat base, a substantially flat top, and a sloping sidewall extending around the circular periphery, and the stand air intake openings are located in the sloping sidewall.

10. The system of claim 9, wherein each of the stand air intake openings has an elongated shape extending in a direction parallel with a surface of the sloping sidewall, and a stand air intake grating is defined by the plurality of stand air intake openings being uniformly spaced in an arc-shaped region of the sloping sidewall.

11. The system of claim 10, wherein the slot intersects the sloping sidewall, and the stand air intake grating is one of a pair of stand air intake gratings disposed on opposing sides of the slot.

12. A method for promoting airflow cooling in a system comprising an electronic device and a stand, the electronic device having a device housing with a lower device housing portion and an upper device housing portion, the stand having a stand housing with a periphery and a base, the stand housing having a slot extending across the periphery, the slot having a shape corresponding to a shape of the lower device housing portion and configured to receive the lower device housing portion, the method comprising:

one or more electronic components emitting thermal energy, the one or more electronic components mounted in an interior of the device housing between the lower device housing portion and the upper device housing portion;

convectionally intaking air into the stand housing through a plurality of stand air intake openings distributed about the periphery between an exterior of the stand housing and an interior of the stand housing;

convectionally communicating the air from a plurality of stand air intake openings to a plurality of device air intake openings in the lower device housing portion, the lower device housing portion extending into the slot;

convectionally communicating the air past the one or more electronic components; and convectionally exhausting the air through a plurality of device air exhaust openings in the upper device housing portion.

13. The method of claim 12, wherein the slot defines a correspondingly slot-shaped opening between the exterior of the stand housing and the interior of the stand housing.

14. The method of claim 12, wherein the device housing is box-shaped, the lower device housing portion is rectangular, and the slot is rectangular.

15. The method of claim 14, wherein the device housing has no airflow openings other than the plurality of device air intake openings in a bottom panel of the device housing and the plurality of device air exhaust openings in a top panel of the device housing.

16. The method of claim 14, wherein the lower device housing portion defines a device housing length, and the device housing length is greater than a length of the slot.

17. The method of claim 16, wherein the device housing further has a device housing height, and the device housing height is at least twice the device housing length.

18. The method of claim 12, wherein the device housing further has a device housing width substantially equal to a width of the slot, and the width of the slot is between one-half and one-quarter a diameter of a widest portion of the stand housing.

19. The method of claim 18, wherein the stand housing has a circular periphery, and the slot is diametrically located across the circular periphery.

20. The method of claim 19, wherein the stand housing has a frusto-conical shape, defined by the substantially flat base, a substantially flat top, and a sloping sidewall extending around the circular periphery, and the stand air intake openings are located in the sloping sidewall.

21. The method of claim 20, wherein each of the stand air intake openings has an elongated shape extending in a direction parallel with a surface of the sloping sidewall, and a stand air intake grating is defined by the plurality of stand air intake openings being uniformly spaced in an arc-shaped region of the sloping sidewall.

22. The method of claim 21, wherein the slot intersects the sloping sidewall, and the stand air intake grating is one of a pair of stand air intake gratings disposed on opposing sides of the slot.

* * * * *